US010541628B2

(12) United States Patent
Arizumi et al.

(10) Patent No.: US 10,541,628 B2
(45) Date of Patent: Jan. 21, 2020

(54) POWER GENERATING DEVICE HAVING A DEFORMABLE ELEMENT THAT GENERATES POWER WHEN DEFORMING

(71) Applicants: Yuko Arizumi, Kanagawa (JP); Tsuneaki Kondoh, Kanagawa (JP); Takahiro Imai, Tokyo (JP); Mizuki Otagiri, Kanagawa (JP); Mayuka Araumi, Tokyo (JP); Tomoaki Sugawara, Kanagawa (JP); Junichiro Natori, Kanagawa (JP); Megumi Kitamura, Tokyo (JP)

(72) Inventors: Yuko Arizumi, Kanagawa (JP); Tsuneaki Kondoh, Kanagawa (JP); Takahiro Imai, Tokyo (JP); Mizuki Otagiri, Kanagawa (JP); Mayuka Araumi, Tokyo (JP); Tomoaki Sugawara, Kanagawa (JP); Junichiro Natori, Kanagawa (JP); Megumi Kitamura, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 321 days.

(21) Appl. No.: 15/352,807

(22) Filed: Nov. 16, 2016

(65) Prior Publication Data

US 2017/0170749 A1    Jun. 15, 2017

(30) Foreign Application Priority Data

Dec. 11, 2015 (JP) ................. 2015-242687

(51) Int. Cl.
*H02N 1/00* (2006.01)
*H02N 1/04* (2006.01)
(Continued)

(52) U.S. Cl.
CPC ............... *H02N 1/04* (2013.01); *H01L 41/22* (2013.01); *H02N 1/004* (2013.01); *H02N 2/183* (2013.01);
(Continued)

(58) Field of Classification Search
CPC .. H02N 1/04; H02N 2/18; H02N 1/00; H02N 2/183; H02N 1/002; H02N 1/004;
(Continued)

(56) References Cited

U.S. PATENT DOCUMENTS 4,250,415 A * 2/1981 Lewiner ................ H02N 1/08
307/400
8,536,760 B1 9/2013 Kim et al.
(Continued)

FOREIGN PATENT DOCUMENTS

CN          104426425       3/2015
EP          1 317 056 A2    6/2003
(Continued)

OTHER PUBLICATIONS

U.S. Appl. No. 15/148,273, filed May 6, 2016.
(Continued)

*Primary Examiner* — Nguyen Tran
*Assistant Examiner* — David A. Singh
(74) *Attorney, Agent, or Firm* — Oblon, McClelland, Maier & Neustadt, L.L.P.

(57) ABSTRACT

A power generating device including an element and a moving member. The element is deformable and generates power when deforming. The moving member moves when receiving a vibration, and contacts the element when moving. When the moving member contacts the element, the element deforms into another state or returns to a previous state.

12 Claims, 9 Drawing Sheets

(51) Int. Cl.
*H02N 2/18* (2006.01)
*H01L 41/22* (2013.01)
*H03H 9/02* (2006.01)
*H01L 41/113* (2006.01)

(52) U.S. Cl.
CPC ........ *H03H 9/02047* (2013.01); *H01L 41/113* (2013.01); *H02N 2/18* (2013.01)

(58) Field of Classification Search
CPC ....... H02N 2/186; H01L 41/113; H01L 41/22; H03H 9/02047
USPC .......................................... 310/310, 339, 308
See application file for complete search history.

(56) References Cited

U.S. PATENT DOCUMENTS

| | | | | |
|---|---|---|---|---|
| 2006/0087200 A1* | 4/2006 | Sakai | ................... | H02N 2/183 310/339 |
| 2010/0308602 A1* | 12/2010 | Schwarz | ................. | H01L 27/20 290/1 R |
| 2014/0111063 A1* | 4/2014 | Bae | ..................... | H01L 41/0477 310/339 |
| 2016/0276957 A1 | 9/2016 | Sugawara et al. | | |
| 2016/0315561 A1* | 10/2016 | Shin | ......................... | H02N 1/04 |
| 2016/0328066 A1 | 11/2016 | Kondoh et al. | | |

FOREIGN PATENT DOCUMENTS

| | | |
|---|---|---|
| JP | 2003-209980 | 7/2003 |
| JP | 2005-168168 | 6/2005 |
| JP | 2009-240011 | 10/2009 |
| JP | 2011-172366 | 9/2011 |
| JP | 2014-039405 | 2/2014 |
| JP | 2014-121204 | 6/2014 |
| WO | WO-2015003497 A1 * | 5/2016 ............... H02N 1/04 |

OTHER PUBLICATIONS

U.S. Appl. No. 15/152,085, filed May 11, 2016.
U.S. Appl. No. 15/145,181, filed May 3, 2016.
Extended European Search Report dated May 11, 2017 in Patent Application No. 16199654.1.
Office Action in Japanese Patent Application No. 2015-242687, dated Aug. 27, 2019.

* cited by examiner

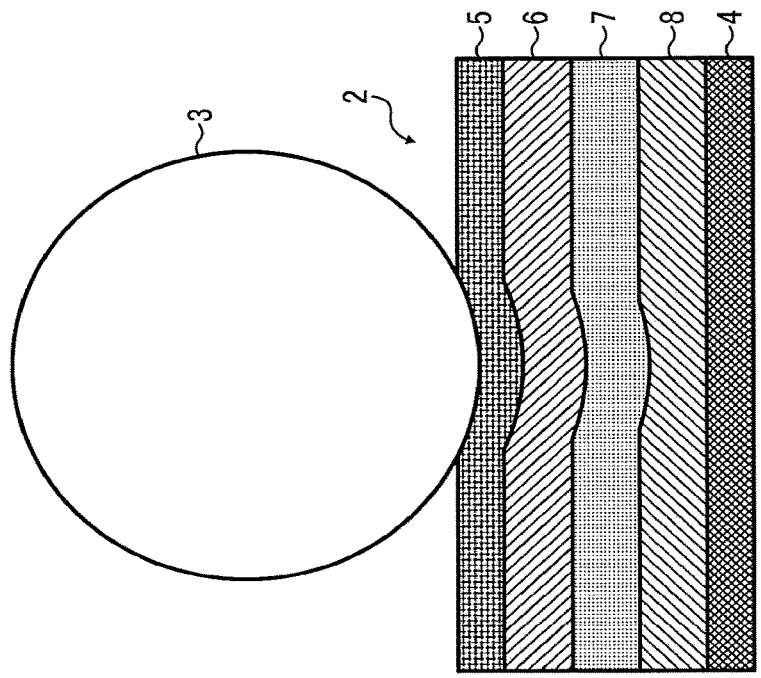
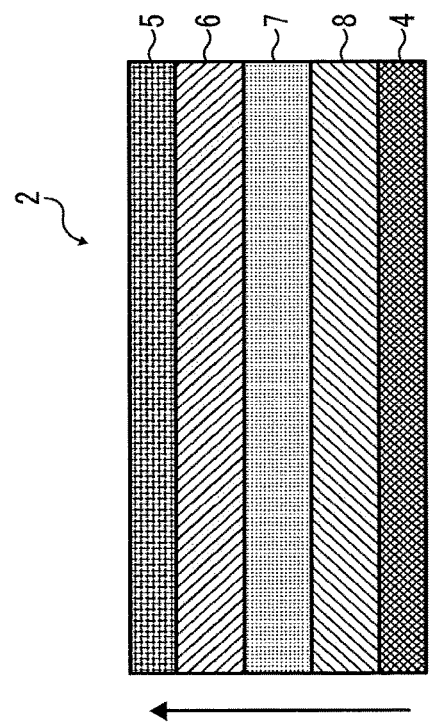

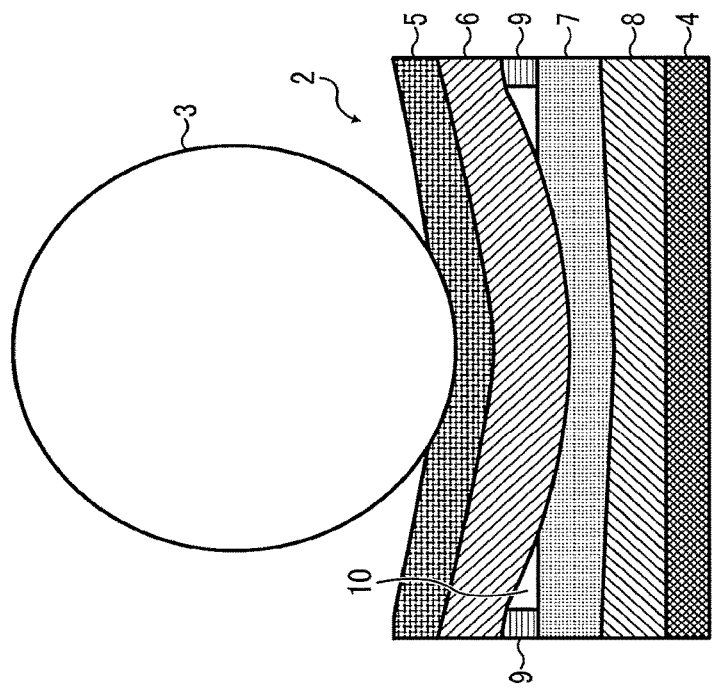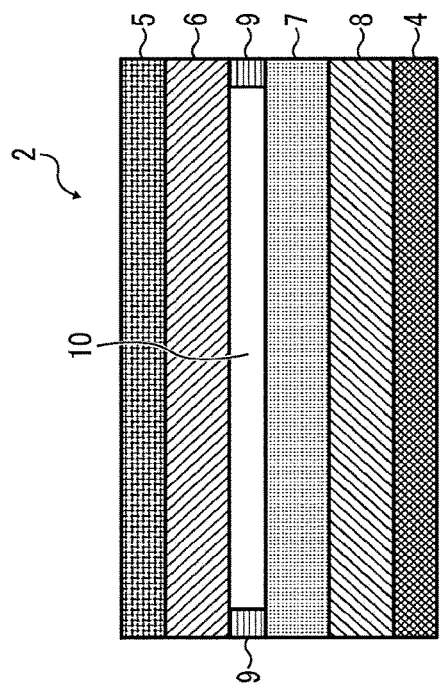

POWER GENERATING DEVICE HAVING A DEFORMABLE ELEMENT THAT GENERATES POWER WHEN DEFORMING

CROSS-REFERENCE TO RELATED APPLICATIONS

This patent application is based on and claims priority pursuant to 35 U.S.C. § 119(a) to Japanese Patent Application No. 2015-242687, filed on Dec. 11, 2015 in the Japan Patent Office, the entire disclosure of which is hereby incorporated by reference herein.

BACKGROUND

Technical Field

The present disclosure relates to a power generating device.

Description of the Related Art

There have been attempts to convert vibration energy into electric energy. Vibration energy is generally generated from vibrations caused by structural bodies (e.g., roads, bridges, buildings, and industrial machineries), moving bodies (e.g., automobiles, railroad cars, and aircraft), and human body movements, and from environmental vibrations (e.g., wave power, wind power).

SUMMARY

In accordance with some embodiments of the present invention, a power generating device is provided. The power generating device includes an element and a moving member. The element is deformable and generates power when deforming. The moving member moves when receiving a vibration, and contacts the element when moving. When the moving member contacts the element, the element deforms into another state or returns to a previous state.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 2A is a cross-sectional view of an element according to an embodiment of the present invention; and FIG. 2B is a cross-sectional view of the element illustrated in FIG. 2A which has been deformed by contact with a moving member;

FIGS. 9A and 9B are cross-sectional views of a power generating device according to an embodiment of the present invention;

Figure 1A:
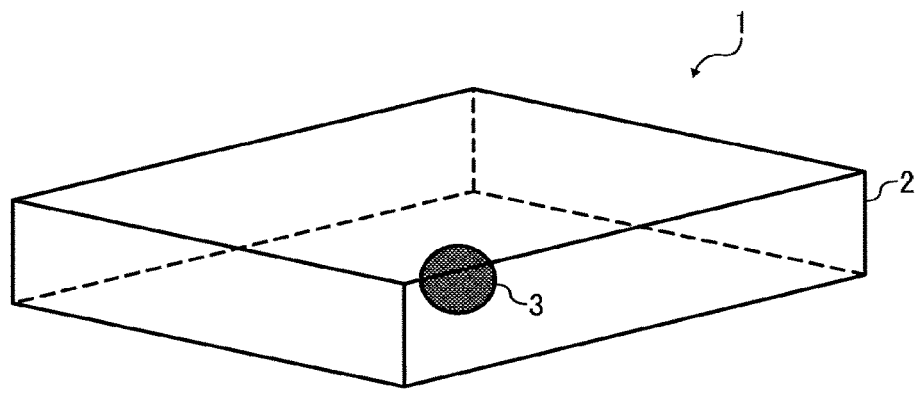
FIGS. 1A and 1B are perspective views of a power generating device according to an embodiment of the present invention.

The accompanying drawings are intended to depict example embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Embodiments of the present invention are described in detail below with reference to accompanying drawings. In describing embodiments illustrated in the drawings, specific terminology is employed for the sake of clarity. However, the disclosure of this patent specification is not intended to be limited to the specific terminology so selected, and it is to be understood that each specific element includes all technical equivalents that have a similar function, operate in a similar manner, and achieve a similar result.

For the sake of simplicity, the same reference number will be given to identical constituent elements such as parts and materials having the same functions and redundant descriptions thereof omitted unless otherwise stated.

In accordance with some embodiments of the present invention, a power generating device that can provide superior power generation performance for an extended period of time is provided.

A first embodiment of the present invention is described below with reference to FIGS. 1A-1B, 2A-2B, and 3A-3C. Referring to FIG. 1A, a power generating device 1 according to the first embodiment of the present invention is in the form of a sealed box. The power generating device 1 includes an element 2 and a moving member 3 having a spherical shape. The element 2 is deformable, and generates power when deforming. The moving member 3 is capable of rolling inside the element 2. The moving member 3 is movable when it externally receives a vibration, and contacts the element 2 when moving. In the present disclosure, "contact" includes the concept of "collision".

The power generating device 1 may be mounted on the basket of a bicycle. In this case, a vibration caused by movement of the bicycle causes the moving member 3 to move and contact the element 2, thereby generating power.

Figure 1B:
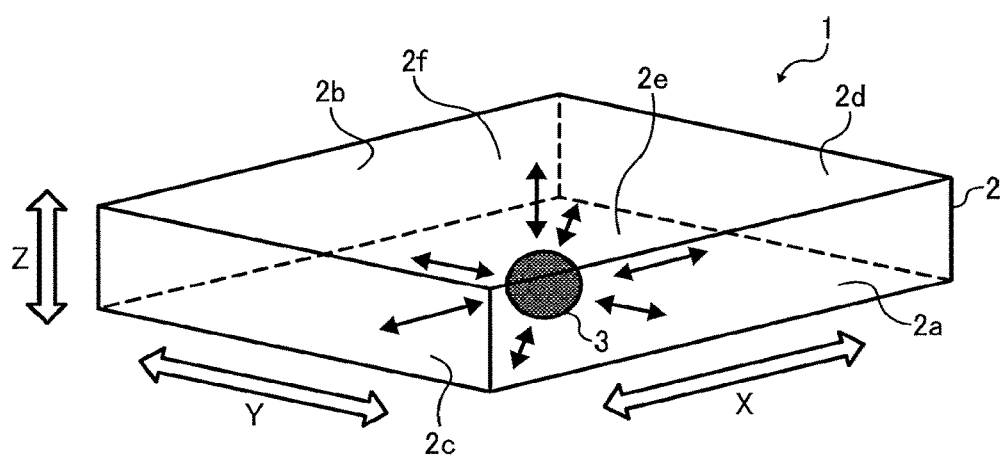

Referring to FIG. 1B, the direction of vibration is basically represented by X direction (horizontal direction), Y direction (depth direction), or Z direction (height direction). In some cases, the direction of vibration is represented by a composite direction thereof.

The element 2 has six inner surfaces 2a, 2b, 2c, 2d, 2e, and 2f. The moving member 3 randomly rolls inside the element 2 to contact one of the inner surfaces 2a, 2b, 2c, 2d, 2e, and 2f or at least two of them at a corner of the element 2.

The element 2 has a height sufficient for the moving member 3 to contact the inner surface 2f (upper surface) when the direction of vibration coincides with Z direction.

Referring to FIG. 2A, the element 2 includes, from the outermost side thereof, a frame 4 that defines the box-like shape of the element 2, a second electrode 8, an intermediate layer 7 having elasticity, a first electrode 6, and a cover member 5 having flexibility.

In other words, the element 2 has a laminated structure in which the cover member 5, the first electrode 6, the intermediate layer 7, the second electrode 8, and the frame 4 are laminated, from the innermost side of the element 2, in the thickness direction of the element 2. The first electrode 6 and the second electrode 8 forms a pair of electrodes that sandwiches the intermediate layer 7 in the thickness direction.

An arrow illustrated in FIG. 2A represents a direction from an outside to an inside of the element 2 in the thickness direction. The moving member 3 is contactable with the cover member 5 disposed innermost of the laminated structure of the element 2.

Referring to FIG. 2B, as the moving member 3 contacts an inner surface of the element 2, the cover member 5, the first electrode 6, the intermediate layer 7, and the second electrode 8 each undergo a deformation. The intermediate layer 7 deforms owing to its elasticity. The first electrode 6 and the second electrode 8 deform owing to their deformation following property attributable to their thin bodies.

Each of the first electrode 6 and the second electrode 8 may be either bonded or unbonded to the intermediate layer 7. Alternatively, each of the first electrode 6 and the second electrode 8 may be partially bonded to the intermediate layer 7.

The intermediate layer 7 includes a rubber and/or a rubber composition. One side of the intermediate layer 7 in the lamination direction has been subjected to a surface modification treatment and/or an inactivation treatment, such that the one side and the other side of the intermediate layer 7 deform to different degrees of deformation when the same deformation imparting force is applied thereto, and that the one side becomes capable of storing charge.

At an unbonded portion of the first electrode 6 and/or the second electrode 8 with the intermediate layer 7, when a deformation is caused, triboelectric charge or peeling charge occurs between the intermediate layer 7 and the electrode to store a charge, and a change in capacitance is generated between the intermediate layer 7 and the electrode to generate power. At a bonded portion of the first electrode 6 and/or the second electrode 8 with the intermediate layer 7, when a deformation is caused, a change in capacitance is generated between the intermediate layer 7 and the electrode to generate power. As the moving member 3 transfers to another portion to release the pressing force applied to the element 2, the deformed portion of the intermediate layer 7 returns to its previous shape, as illustrated in FIG. 2A, owing to its elasticity.

The element 2 also generates power when returning to its previous state in the same manner as when the element 2 deforms into another state by contact with the moving member 3.

In a state in which the moving member 3 is put on the inner surface 2e (bottom surface) of the element 2, a deformation is caused in the element 2 due to the weight of the moving member 3, as illustrated in FIG. 2B. However, neither charge transfer nor power generation is caused in the element 2 unless the moving member 3 moves.

An impact from the moving member 3 is absorbed by the intermediate layer 7, as well as the element 2, that is undergoing an elastic deformation. Therefore, the element 2 returns to its previous state and never gets broken even when the moving member 3 repeatedly impacts the element 2. Thus, the element 2 is capable of maintaining high power generating ability for an extended period of time.

Since the moving member 3 is disposed within a closed box-like space, the moving member 3 is capable of generating power regardless of the direction of movement. In addition, the moving member 3 is capable of generating power even when the direction of vibration is irregularly variable.

Figure 3A:
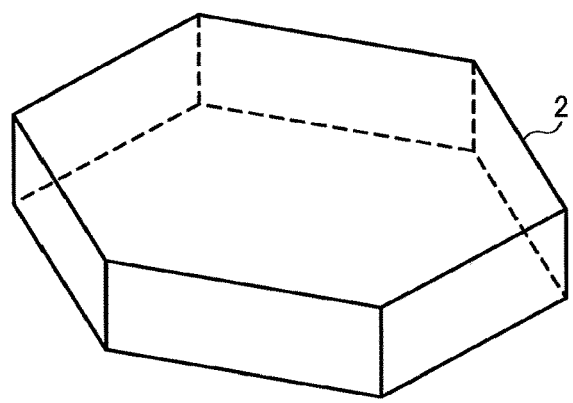
FIGS. 3A to 3C are perspective views of elements according to some embodiments of the present invention, in various shapes.
Figure 3B:
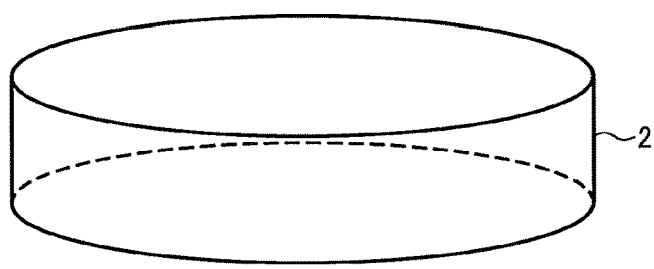
Figure 3C:
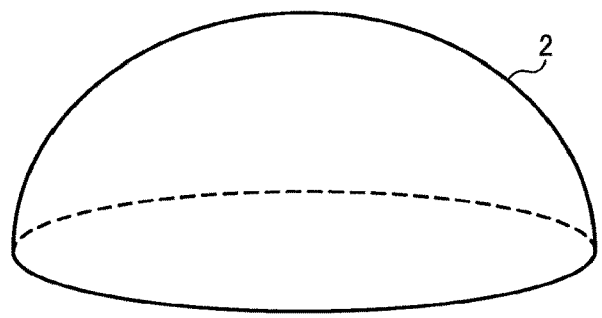

The element 2 is not limited in shape. The element 2 may be in the form of a cuboid, an octahedron (e.g., hexagonal column) as illustrated in FIG. 3A, a cylinder as illustrated in FIG. 3B, or a hemisphere as illustrated in FIG. 3C.

The element 2 may be in a shape having either a closed space, as is the case with the above-described examples, or an opened space. In the latter case, the moving member 3 is hooked up with a string-like member so as to move just within the opened space of the element 2 without protruding therefrom.

The intermediate layer 7 includes a silicone rubber that has been subjected to a surface modification treatment and an inactivation treatment. Owing to the surface modification treatment, both sides of the intermediate layer 7, respectively facing the first electrode 6 and the second electrode 8, deform to different degrees of deformation when the same deformation imparting force is applied thereto. In other words, one side of the intermediate layer 7 is different from the other side thereof in terms of hardness. This property improves power generating efficiency of the element 2.

First Electrode and Second Electrode

The first electrode 6 and the second electrode 8 are not limited in material, shape, size, and structure.

The first electrode 6 and the second electrode 8 are either common or different in material, shape, size, and/or structure. Preferably, the first electrode 6 and the second electrode 8 are common in these properties.

Specific examples of materials used for the first electrode 6 and the second electrode 8 include, but are not limited to, metals, carbon-based conductive materials, and conductive rubber compositions.

Specific examples of the metals include, but are not limited to, gold, silver, copper, aluminum, stainless steel, tantalum, nickel, and phosphor bronze. Specific examples of the carbon-based conductive materials include, carbon nanotube, carbon fibers, and graphite. Specific examples of the conductive rubber compositions include, but are not limited to, a composition including a conductive filler and a rubber.

Specific examples of the conductive filler include, but are not limited to, carbon materials (e.g., Ketjen black, acetylene black, graphite, carbon fiber (CF), carbon nanofiber (CNF), carbon nanotube (CNT), graphene), metal fillers (e.g., gold, silver, platinum, copper, aluminum, nickel), conductive polymeric materials (e.g., derivatives of polythiophene, polyacetylene, polyaniline, polypyrrole, polyparaphenylene, or polyparaphenylene vinylene, to which a dopant, such as anion and cation, may be added), and ionic liquids. Each of these materials can be used alone or in combination with others.

Specific examples of the rubber include, but are not limited to, silicone rubber, modified silicone rubber, acrylic rubber, chloroprene rubber, polysulfide rubber, urethane rubber, isobutyl rubber, fluorosilicone rubber, ethylene rubber, natural rubber (latex), ethylene propylene rubber, nitrile rubber, and fluorine rubber. Each of these materials can be used alone or in combination with others.

The first electrode 6 and the second electrode 8 may be in the form of a thin film. The first electrode 6 and the second electrode 8 may be made of woven fabric, non-woven fabric, knit fabric, mesh, sponge, or non-woven fabric formed by layering fibrous carbon materials.

The first electrode 6 and the second electrode 8 preferably have an average thickness in the range of from 0.01 μm to 1 mm, more preferably from 0.1 to 500 μm, from the aspect of conductivity and flexibility. When the average thickness is 0.01 μm or more, mechanical strength becomes appropriate and conductivity improves. When the average thickness is 1 mm or less, the element becomes deformable, thus providing good power generation performance.

Intermediate Layer

The intermediate layer 7 has flexibility.

The intermediate layer 7 satisfies at least one of the following conditions (1) and (2).

Condition (1): When a pressure is applied to the intermediate layer 7 from a direction perpendicular to the plane of the intermediate layer 7, the amount of deformation of a first side of the intermediate layer 7 facing the first electrode 6 and that of a second side of the intermediate layer 7 facing the second electrode 8 are different.

Condition (2): The universal hardness (H1) of the first side of the intermediate layer 7 facing the first electrode 6 and the universal hardness (H2) of the second side of the intermediate layer 7 facing the second electrode 8 are different, when the indentation depth is 10 μm.

As the amount of deformation or the hardness is different between both sides of the intermediate layer 7, a large amount of power can be generated.

Here, the amount of deformation is defined as the maximum indentation depth of an indenter, when the indenter is pressed against the intermediate layer 7 under the following conditions.

Measurement Conditions

Measuring instrument: Microhardness tester WIN-HUD available from Fischer

Indenter: Quadrangular diamond indenter having a facing angle of 136°

Initial load: 0.02 mN

Maximum load: 1 mN

Load increasing time from initial load to maximum load: 10 seconds

The universal hardness is measured under the following conditions.

Measurement Conditions

Measuring instrument: Microhardness tester WIN-HUD available from Fischer

Indenter: Quadrangular diamond indenter having a facing angle of 136°

Indentation depth: 10 μm

Initial load: 0.02 mN

Maximum load: 100 mN

Load increasing time from initial load to maximum load: 50 seconds

The ratio (H1/H2) of the universal hardness (H1) to the universal hardness (H2) is preferably 1.01 or more, more preferably 1.07 or more, and most preferably 1.13 or more. The upper limit of the ratio (H1/H2) is variable according to the degree of flexibility required by the use condition and/or the load applied in the use condition. However, the ratio (H1/H2) is preferably 1.70 or less. The universal hardness (H1) is a hardness of a relatively hard surface. The universal hardness (H2) is a hardness of a relatively soft surface.

Specific examples of materials used for the intermediate layer 7 include, but are not limited to, rubbers and rubber compositions. Specific examples of the rubbers include, but are not limited to, silicone rubber, fluorosilicone rubber, acrylic rubber, chloroprene rubber, natural rubber (latex), urethane rubber, fluorine rubber, and ethylene propylene rubber. Each of these materials can be used alone or in combination with others. Among these rubbers, silicone rubber is preferable.

The silicone rubber is not limited in structure so long as organosiloxane bonds are included. Specific examples of the silicone rubber include, but are not limited to, dimethyl silicone rubber, methyl phenyl silicone rubber, modified (e.g., acrylic-modified, alkyd-modified, ester-modified, epoxy-modified) silicone rubber. Each of these materials can be used alone or in combination with others.

Specific examples of the rubber compositions include, but are not limited to, a composition including a filler and at least one of the above-described rubbers. Among these rubber compositions, a silicone rubber composition including the above-described silicone rubbers is preferable.

The filler may be either an organic filler, an inorganic filler, or an organic-inorganic composite filler. Any organic compounds can be used as the organic filler. Specific examples of the organic filler include, but are not limited to, fine particles of acrylic resin, melamine resin, or fluororesin (e.g., polytetrafluoroethylene), silicone powder (e.g., silicone resin powder, silicone rubber powder, silicone composite powder), rubber powder, wood powder, pulp, and starch. Any inorganic compounds can be used as the inorganic filler.

Specific examples of the inorganic filler include, but are not limited to, oxides, hydroxides, carbonates, sulfates, silicates, nitrides, carbons, metals, and other compounds.

Specific examples of the oxides include, but are not limited to, silica, diatom earth, alumina, zinc oxide, titanium oxide, iron oxide, and magnesium oxide.

Specific examples of the hydroxides include, but are not limited to, aluminum hydroxide, calcium hydroxide, and magnesium hydroxide.

Specific examples of the carbonates include, but are not limited to, calcium carbonate, magnesium carbonate, barium carbonate, and hydrotalcite.

Specific examples of the sulfates include, but are not limited to, aluminum sulfate, calcium sulfate, and barium sulfate.

Specific examples of the silicates include, but are not limited to, calcium silicate (e.g., wollastonite, xonotlite), zirconia silicate, kaolin, talc, mica, zeolite, pearlite, bentonite, montmorillonite, sericite, activated clay, glass, and hollow glass beads.

Specific examples of the nitrides include, but are not limited to, aluminum nitride, silicon nitride, and boron nitride.

Specific examples of the carbons include, but are not limited to, Ketjen black, acetylene black, graphite, carbon fiber, carbon nanofiber, carbon nanotube, fullerene (and derivatives thereof), and graphene.

Specific examples of the metals include, but are not limited to, gold, silver, platinum, copper, iron, aluminum, and nickel.

Specific examples of the other compounds include, but are not limited to, potassium titanate, barium titanate, strontium titanate, lead zirconate titanate, silicon carbide, and molybdenum sulfide. The inorganic filler may be surface-treated.

As the organic-inorganic composite filler, a compound in which an organic compound and an inorganic compound are combined on the molecular level may be used.

Specific examples of the organic-inorganic composite filler include, but are not limited to, silica-acrylic composite particles and silsesquioxane.

The filler preferably has an average particle diameter in the range of from 0.01 to 30 μm, more preferably from 0.1 to 10 μm. When the average particle diameter is 0.01 μm or more, power generation performance may be improved. When the average particle diameter is 30 μm or less, the intermediate layer 7 becomes deformable, thus improving power generation performance.

The average particle diameter can be measured by a known particle size distribution analyzer, such as MICROTRACK HRA (available from Nikkiso Co., Ltd.), by a known method.

The content of the filler in the rubber composition is preferably in the range of from 0.1 to 100 parts by mass, more preferably from 1 to 50 parts by mass, based on 100 parts by mass of the rubber. When the content is 0.1 parts by mass or more, power generation performance may be improved. When the content is 100 parts by mass or less, the intermediate layer 7 becomes deformable, thus improving power generation performance.

The rubber composition may further include other components, such as an additive. The contents of the other components may be appropriately determined so long as the effect of the present invention is not damaged.

Specific examples of the additive include, but are not limited to, a cross-linker, a deterioration preventer, a heat resistant agent, and a colorant.

Materials used for the intermediate layer 7 may be prepared by any known method. For example, the rubber composition may be prepared by mixing the rubber, the filler, and other optional components, and kneading the mixture.

The intermediate layer 7 may be formed by any known method. For example, a thin layer of the rubber composition may be formed by hardening the rubber composition, coated on a substrate by means of blade coating, die coating, or dip coating, with heat or electron beam.

The intermediate layer 7 preferably has an average thickness in the range of from 1 μm to 10 mm, more preferably from 20 μm to 1 mm, from the aspect of deformation following property. When the average thickness is within the above preferable range, the intermediate layer 7 can exhibit sufficient film formation property without inhibiting deformation property, thus providing good power generation performance.

Preferably, the intermediate layer 7 has insulation property. More specifically, the intermediate layer 7 preferably has a volume resistivity of $10^8$ Ωcm or more, more preferably $10^{10}$ Ωcm or more. The intermediate layer 7 may have a multi-layered structure.

Surface Modification Treatment and Inactivation Treatment

As methods for making both sides of the intermediate layer 7 different in the amount of deformation or hardness, a surface modification treatment and/or an inactivation treatment may be employed. Such treatments may be performed for either both sides or one side of the intermediate layer 7.

Surface Modification Treatment

Specific examples of the surface modification treatment include, but are not limited to, plasma treatment, corona discharge treatment, electron irradiation treatment, ultraviolet irradiation treatment, ozone treatment, and radiation (e.g., X-ray, α-ray, β-ray, γ-ray, neutron ray) irradiation treatment. From the aspect of processing speed, plasma treatment, corona discharge treatment, and electron irradiation treatment are preferable. The surface modification treatment is not limited to any particular treatment so long as a certain degree of irradiation energy is sufficiently provided to modify a material.

Plasma Treatment

Plasma generators for use in the plasma treatment may be of parallel plate type, capacitive coupling type, or inductive coupling type. In addition, atmospheric pressure plasma generators may also be used for the plasma treatment. In particular, a reduced-pressure plasma treatment is preferable from the aspect of durability.

The reaction pressure in the plasma treatment is preferably in the range of from 0.05 to 100 Pa, and more preferably from 1 to 20 Pa.

As the reaction atmosphere in the plasma treatment, inert gas, rare gas, and oxygen gas are suitable. In particular, argon is preferable from the aspect of persistence of the effect.

The reaction atmosphere preferably has an oxygen partial pressure of 5,000 ppm or less. When the reaction atmosphere has an oxygen partial pressure of 5,000 ppm or less, generation of ozone is suppressed and the use of an ozone treatment equipment is reduced.

In the plasma treatment, the amount of irradiation electric energy, defined by the product of output and irradiation time, is preferably in the range of from 5 to 200 Wh, more preferably from 10 to 50 Wh. When the amount of irradiation electric energy is within the above preferable range, the intermediate layer 7 is given a power generation function without degrading durability by excessive irradiation.

Corona Discharge Treatment

In the corona discharge treatment, the amount of applied (accumulated) energy is preferably in the range of from 6 to 300 J/cm$^2$, more preferably from 12 to 60 J/cm$^2$. When the amount of applied energy is within the above preferable range, the intermediate layer 7 is given a power generation function without degrading durability by excessive irradiation.

Electron Irradiation Treatment

In the electron irradiation treatment, the irradiation amount is preferably 1 kGy or more, and more preferably in the range of from 300 kGy to 10 MGy. When the irradiation amount is within the above preferable range, the intermediate layer 7 is given a power generation function without degrading durability by excessive irradiation.

As the reaction atmosphere in the electron irradiation treatment, an inert gas (e.g., argon gas, neon gas, helium gas, nitrogen gas) having an oxygen partial pressure of 5,000 ppm or less is preferable. When the reaction atmosphere has an oxygen partial pressure of 5,000 ppm or less, generation of ozone is suppressed and the use of an ozone treatment equipment is reduced.

Ultraviolet Irradiation Treatment

In the ultraviolet irradiation treatment, the ultraviolet ray preferably has a wavelength of from 200 to 365 nm, more preferably from 240 to 320 nm.

In the ultraviolet irradiation treatment, the accumulated amount of light is preferably in the range of from 5 to 500 J/cm$^2$, more preferably from 50 to 400 J/cm$^2$. When the accumulated amount of light is within the above preferable range, the intermediate layer 7 is given a power generation function without degrading durability by excessive irradiation.

As the reaction atmosphere in the ultraviolet irradiation treatment, an inert gas (e.g., argon gas, neon gas, helium gas, nitrogen gas) having an oxygen partial pressure of 5,000 ppm or less is preferable. When the reaction atmosphere has an oxygen partial pressure of 5,000 ppm or less, generation of ozone is suppressed and the use of an ozone treatment equipment is reduced.

There is a conventional technology for improving an interlayer adhesion force by forming active groups by means of excitation or oxidization caused by a plasma treatment, corona discharge treatment, ultraviolet irradiation treatment, or electron irradiation treatment. However, such a technology has a limited application to improvement of interlayer adhesion force. It is known that application of that technology to outermost surface modification treatments causes a significant deterioration in releasability of the outermost surface, which is not preferable. Moreover, in that technology, a reactive active group (e.g., hydroxyl group) is efficiently introduced under an oxygen-rich reaction condition. That conventional technology is essentially different from the surface modification treatments in accordance with some embodiments of the present invention.

The plasma treatment, as an example of the surface modification treatment in accordance with some embodiments of the present invention, is performed under a reduced-pressure environment with a small amount of oxygen. Such a plasma treatment accelerates re-cross-linkage or recombination of the surface and increases the number of Si—O bonds having a high bond energy, improving the durability of the surface.

In addition, since the surface is densified owing to the increased cross linkage density, the releasability of the surface is also improved. Although active groups are formed in part, such active groups are inactivated by a coupling agent or an air drying treatment.

Inactivation Treatment

The surface of the intermediate layer 7 may be subjected to an inactivation treatment using any material.

The inactivation treatment is not limited to any particular process so long as the surface of the intermediate layer 7 is inactivated. For example, the inactivation treatment may include imparting an inactivator to the surface of the intermediate layer 7. Here, inactivation of the intermediate layer 7 refers to a phenomenon in which the nature of the surface of the intermediate layer 7 is changed to have less chemical reactivity. Specifically, the degree of activity of the surface of the intermediate layer 7 is reduced by reacting the surface with an inactivator with active groups (e.g., —OH groups) generated by excitation or oxidization caused by a plasma treatment, corona discharge treatment, ultraviolet irradiation treatment, or electron irradiation treatment.

Specific examples of the inactivator include, but are not limited to, an amorphous resin and a coupling agent. Specific examples of the amorphous resin include, but are not limited to a resin having a perfluoropolyether structure in its main backbone.

Specific examples of the coupling agent include, but are not limited to, a metal alkoxide, and a solution containing a metal alkoxide.

Specific examples of the metal alkoxide include, but are not limited to, a compound represented by the following formula (1), a partially-hydrolyzed polycondensate thereof having a polymerization degree of about 2 to 10, and a mixture thereof.

$$R^1{}_{(4-n)}Si(OR^2)_n \qquad (1)$$

In the formula (1), each of $R^1$ and $R^2$ independently represents a straight-chain or branched-chain alkyl group having 1 to 10 carbon atoms, an alkyl polyether chain, or an aryl group; and n represents an integer of from 2 to 4.

The inactivation treatment may be performed by, for example, subjecting a precursor (e.g., rubber) of the intermediate layer 7 to the surface modification treatment first, and then coating or impregnating (e.g., by means of dipping) the surface of the precursor of the intermediate layer 7 with an inactivator.

When a silicone rubber is used as the precursor of the intermediate layer 7, the silicone rubber may be subjected to the surface modification treatment first, and then left at rest in the air to be inactivated through air drying.

Preferably, the oxygen concentration profile of the intermediate layer 7 has a local maximum value in the thickness direction. Preferably, the carbon concentration profile of the intermediate layer 12 has a local minimum value in the thickness direction.

Preferably, in the intermediate layer 7, a position which indicates a local maximum value in the oxygen concentration profile is coincident with a position which indicates a local minimum value in the carbon concentration profile.

The oxygen concentration profile and the carbon concentration profile can be determined by X-ray photoelectron spectroscopy (XPS) under the following conditions.

Measurement Conditions

Measurement Device: ULVAC-PHI QUANTERA SXM available from ULVAC-PHI, Inc.

Measurement Light Source: Al (mono)

Measurement Output: 100 μm φ, 25.1 W

Measurement Area: 500 μm×300 μm

Pass Energy: 55 eV (narrow scan) Energy Step: 0.1 eV (narrow scan)

Relative Sensitivity Factor: Relative sensitivity factor of PHI is used

Sputter Source: C60 Cluster ion

Ion Gun Output: 10 kV, 10 nA

Raster Control: (X=0.5, Y=2.0) mm

Sputter Rate: 0.9 nm/min (SiO$_2$ conversion)

XPS analyzes atomic composition and binding state of a target object by capturing electrons which escaped from the target object by the photoelectron effect.

Silicone rubbers have siloxane bonds. The major components of silicone rubbers include Si, O, and C. In a case in which the intermediate layer 7 is formed of a silicone rubber, the atomic composition of the intermediate layer 7 in the depth direction, in other words, the atomic concentration (%) distribution of the major atoms (Si, O, or C) ranging from the surface part to the inner part of the intermediate layer 7, can be determined from a relative peak strength ratio in a wide scan spectrum measured by XPS. One example of the wide scan spectrum is illustrated in FIG. 4.

Figure 4:
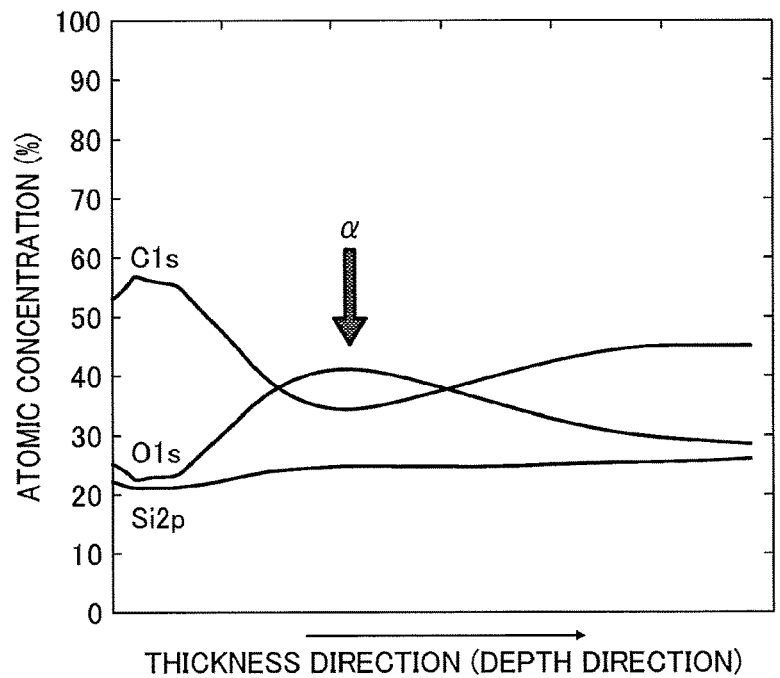
FIG. 4 is an XPS (X-ray photoelectron spectroscopy) chart of a surface-modified inactivated intermediate layer, formed of a silicone rubber, of a power generating device according to an embodiment of the present invention.

The spectrum illustrated in FIG. 4 is measured with one sample of the intermediate layer 7 which is prepared by subjecting a silicone rubber to the above-described plasma treatment (as the surface modification treatment) and the above-described inactivation treatment. In FIG. 4, the horizontal axis represents the analysis depth measured from the surface part toward the inner part, and the vertical axis represents the atomic concentration (%).

In the case of a silicone rubber, elements bound to silicon atoms and the binding state thereof can be determined by measuring the energy of electrons escaped faun the Si2p orbit. Specifically, by separating peaks in a narrow scan spectrum of the Si2p orbit, which indicates binding state of Si, a chemical binding state of Si can be determined.

Figure 5:
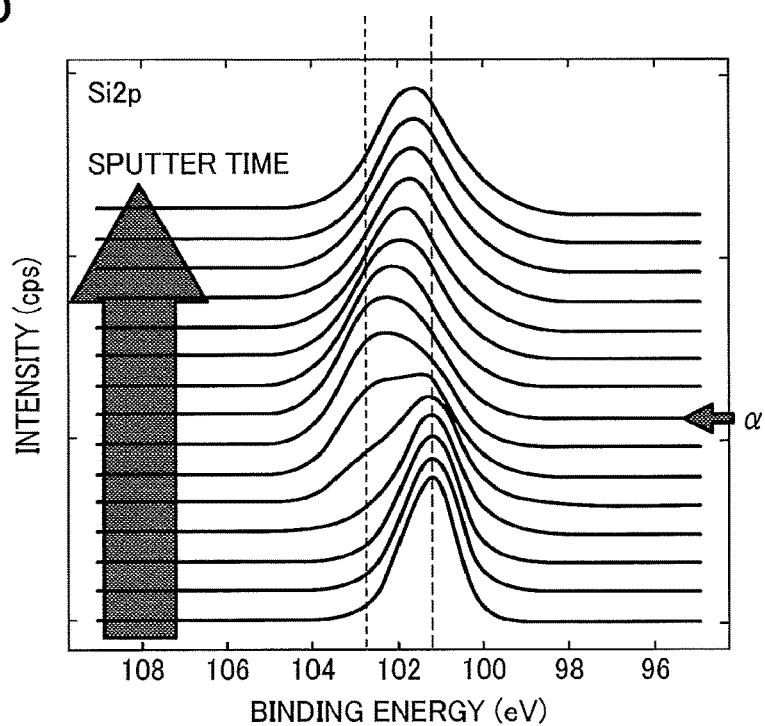
FIG. 5 is a graph showing a variation in the Si2p binding energy of the intermediate layer used to obtain the chart of FIG. 4 in the thickness direction.

The result of peak separation is illustrated in FIG. 5. The graph illustrated in FIG. 5 was measured with the same sample of the intermediate layer 7 used to obtain the chart of FIG. 4. In FIG. 5, the horizontal axis represents binding energy, and the vertical axis represents intensity. Each curve represents a spectrum measured at each depth. A spectrum on a lower side indicates a greater (deeper) measurement depth.

It is generally known that the amount of peak shift depends on the binding state. In the case of the silicone rubber according to the present embodiment, the peak is shifted toward a high-energy side with respect to the Si2p orbit. This indicates that the amount of oxygen atoms bound to Si has been increased.

As the silicone rubber is subjected to the surface modification treatment and the inactivation treatment, the amount of oxygen is increased from the surface part toward the inner part while exhibiting a local maximum value, while the amount of carbon is decreased while exhibiting a local minimum value. As the silicone rubber is further analyzed in the depth direction, the amount of oxygen is decreased and the amount of carbon is increased to have the same atomic composition as an untreated silicone rubber.

The fact that the local maximum value in the oxygen concentration profile is detected at the position a in FIG. 4 is coincident with the fact that the Si2p binding energy is shifted to a high-energy side (as indicated by a in FIG. 5). This indicates that an increase of oxygen atoms is detected from the number of oxygen atoms bound to Si.

Figure 6:
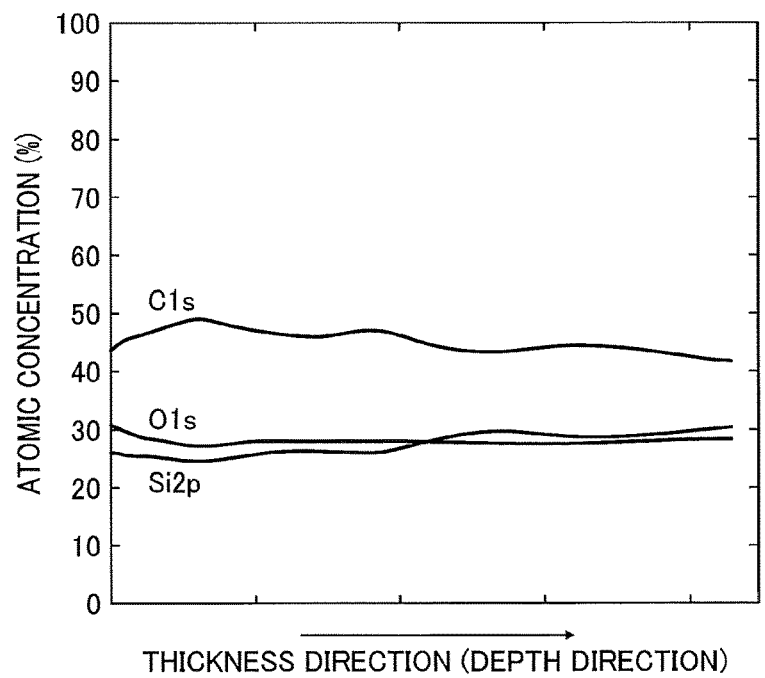
FIG. 6 is an XPS chart of an untreated intermediate layer, formed of a silicone rubber.
Figure 7:
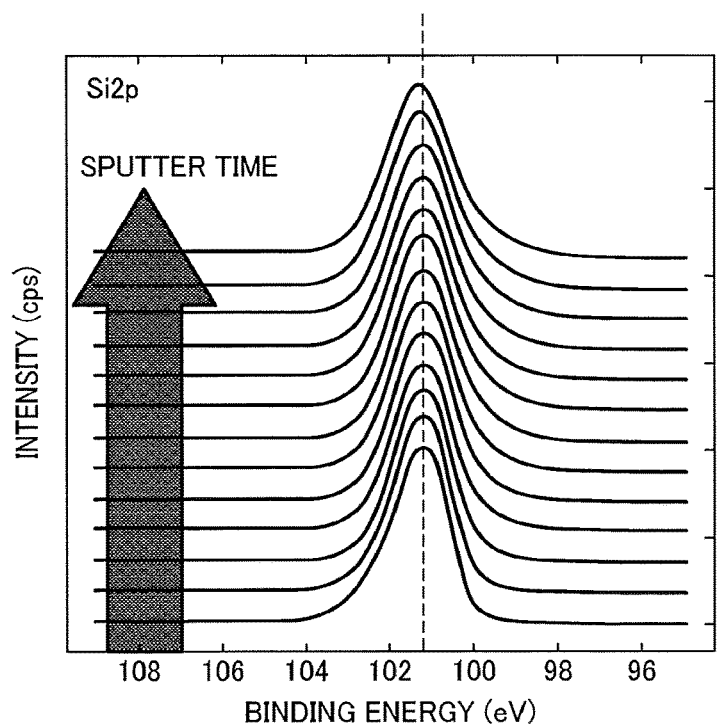
FIG. 7 is a graph showing a variation in the Si2p binding energy of the intermediate layer used to obtain the chart of FIG. 6 in the thickness direction.

FIGS. 6 and 7 show results for an untreated silicone rubber with respect to the same analysis performed to obtain graphs of FIGS. 4 and 5, respectively.

In FIG. 6, no local maximum value is observed in the oxygen concentration profile, and no local minimum value is observed in the carbon concentration profile, in contrast to FIG. 4. In addition, in FIG. 7, the Si2p binding energy is not shifted to a high-energy side. This indicates that the number of oxygen atoms bound to Si has not been changed.

As the surface of the intermediate layer 7 is coated or impregnated (e.g., by means of dipping) with the inactivator (e.g., a coupling agent), the inactivator gradually penetrates the intermediate layer 7. In a case in which the coupling agent is the compound represented by the formula (1), polyorganosiloxane will be distributed within the intermediate layer 7. The concentration distribution of oxygen atoms included in the polyorganosiloxane will exhibit a local maximum value in the depth direction.

As a result, the intermediate layer 7 comes to include polyorganosiloxane containing silicon atoms bound to 3 to 4 oxygen atoms.

The inactivation treatment is not limited to dipping, so long as oxygen atoms included in polyorganosiloxane are distributed such that the concentration distribution thereof exhibits a local maximum value in the depth direction (thickness direction). Specific examples of the inactivation treatment include, but are not limited to, plasma CVD (chemical vapor deposition), PVD (physical vapor deposition), sputtering, vacuum deposition, and combustion chemical vapor deposition.

The intermediate layer 7 need not necessarily have an initial surface potential at rest. The initial surface potential at rest can be measured under the conditions described below. Here, having no initial surface potential refers to having an initial surface potential of ±10 V or less, when measured under the following conditions.

Measurement Conditions

Pretreatment: Left at rest in an atmosphere having a temperature of 30° C. and a relative humidity of 40% for 24 hours and subjected to a neutralization for 60 seconds (using an instrument SJ-F300 available from Keyence Corporation).

Instrument: Treck Model 344
Measurement Probe: 6000B-7C
Measurement Distance: 2 mm Measurement Spot Diameter: 10 mm Within the element according to the present embodiment, a bias in capacitance is caused upon a charging, the mechanism of which is similar to triboelectric charging, and a generation of surface potential difference due to inner charge retention, according to the difference in deformation amount between both sides of the intermediate layer 7 that is caused by the difference in hardness therebetween. It is considered that such a bias in capacitance causes charge transfer and further causes power generation.

Preferably, a space is provided between the intermediate layer 7 and at least one of the first electrode 6 and the second electrode 8, to increase the amount of power generation.

For example, such a space can be provided by disposing a spacer between the intermediate layer 7 and at least one of the first electrode 6 and the second electrode 8, as described below with respect to a second embodiment.

The spacer is not limited in material, configuration, shape, and size. Specific examples of materials used for the spacer include, but are not limited to, polymeric materials, rubbers, metals, conductive polymeric materials, and conductive rubber compositions.

Specific examples of the polymeric materials include, but are not limited to, polyethylene, polypropylene, polyethylene terephthalate, polyvinyl chloride, polyimide resin, fluororesin, and acrylic resin. Specific examples of the rubber include, but are not limited to, silicone rubber, modified silicone rubber, acrylic rubber, chloroprene rubber, polysulfide rubber, urethane rubber, isobutyl rubber, fluorosilicone rubber, ethylene rubber, and natural rubber (latex).

Specific examples of the metals include, but are not limited to, gold, silver, copper, aluminum, stainless steel, tantalum, nickel, and phosphor bronze. Specific examples of the conductive polymeric materials include, but are not limited to, polythiophene, polyacetylene, and polyaniline. Specific examples of the conductive rubber compositions include, but are not limited to, a composition including a conductive filler and a rubber. Specific examples of the conductive filler include, but are not limited to, carbon materials (e.g., Ketjen black, acetylene black, graphite, carbon fiber, carbon nanofiber, carbon nanotube, graphene), metal fillers (e.g., gold, silver, platinum, copper, iron, aluminum, nickel), conductive polymeric materials (e.g., derivatives of polythiophene, polyacetylene, polyaniline, polypyrrole, polyparaphenylene, or polyparaphenylene vinylene, to which a dopant, such as anion and cation, may be added), and ionic liquids.

Specific examples of the rubber include, but are not limited to, silicone rubber, modified silicone rubber, acrylic rubber, chloroprene rubber, polysulfide rubber, urethane rubber, isobutyl rubber, fluorosilicone rubber, ethylene rubber, and natural rubber (latex).

The spacer may be in the form of a sheet, film, woven fabric, non-woven fabric, mesh, or sponge.

The shape, size, thickness, and installation location of the spacer are appropriately determined according to the structure of the element.

Figure 8:
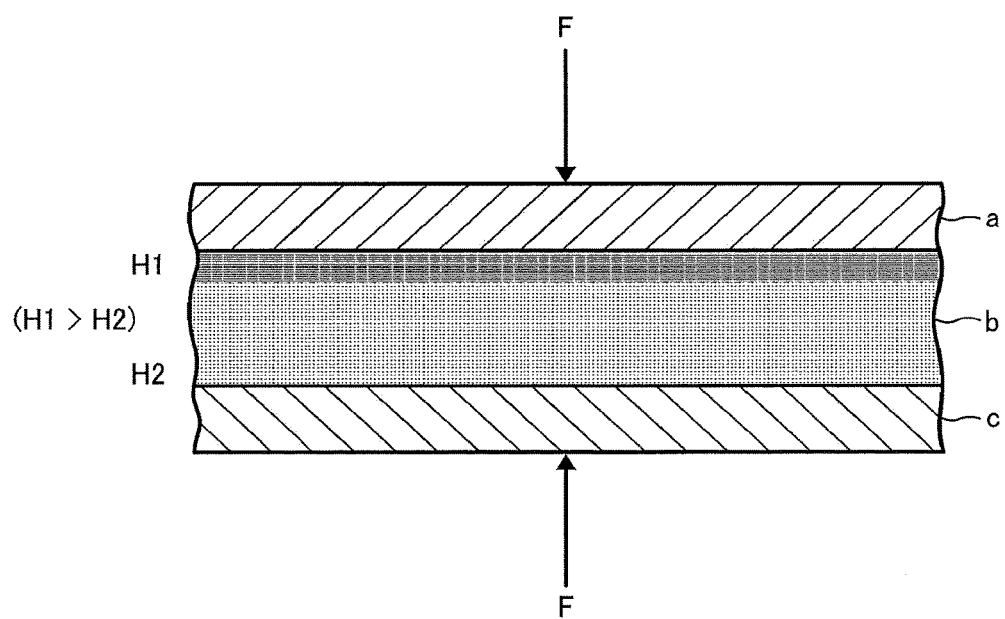
FIG. 8 is a cross-sectional view of an element including a surface-modified inactivated intermediate layer according to an embodiment of the present invention.

In the embodiment illustrated in FIG. 8, the first electrode 6, the intermediate layer 7, and the second electrode 8 are indicated by symbols a, b, and c, respectively. In a case in which one side of the intermediate layer b which faces the first electrode a is subjected to the surface modification treatment or the inactivation treatment, the universal hardness H1 of that side of the intermediate layer b which faces the first electrode a becomes greater than the universal hardness H2 of the other side of the intermediate layer b which faces the second electrode c.

When a pressing force F is respectively applied to both sides of the intermediate layer b, the degree of deformation of one side of the intermediate layer b facing the first electrode a becomes smaller than that of the other side of the intermediate layer b facing the second electrode c.

Cover Member

The cover member 5 is not limited in material, shape, size, thickness, and structure. Specific examples of materials used for the cover member 5 include, but are not limited to, polymeric materials and rubbers.

Specific examples of the polymeric materials include, but are not limited to, polyethylene, polypropylene, polyethylene terephthalate, polyvinyl chloride, polyimide resin, fluororesin, and acrylic resin.

Specific examples of the rubbers include, but are not limited to, silicone rubber, fluorosilicone rubber, fluorine rubber, urethane rubber, acrylic rubber, chloroprene rubber, butyl rubber, ethylene propylene rubber, nitrile rubber, polysulfide rubber, and natural rubber (latex).

Moving Member

Specific examples of materials used for the moving member 3 include, but are not limited to, iron, chrome steel, stainless steel, alumina, zirconia, acrylic polymers, polyethylene, polypropylene, nylon, fluororesin, rubber, and glass.

The moving member 3 may be in the shape of a sphere, oval sphere, or cylinder, each of which may have convexities or projections on the surface.

The moving member 3 is not limited in size so long as the moving member 3 can fit inside the space of the element 2.

The number of moving members 3 is not limited so long as all the moving members 3 can fit inside the space of the element 2.

A second embodiment of the present invention is described below with reference to FIGS. 9A and 9B. For the sake of simplicity, the same reference number will be given to identical constituent elements such as parts and materials having the same functions and redundant descriptions thereof omitted unless otherwise stated.

Referring to FIG. 9A, in the second embodiment, a spacer 9 is disposed between the first electrode 6 and the intermediate layer 7 to create a space 10.

As illustrated in FIG. 9B, as the moving member 3 contacts the element 2 when receiving a vibration, the element 2 gradually deforms (gets curved downward) to apply an external force to the intermediate layer 7, thus generating power. As the element 2 and the moving member 3 get separated from each other, the element 2 returns to its previous state as illustrated in FIG. 9A, thus also generating power.

Owing to the presence of the space 10, the element 2 is capable of easily deforming even when the externally applied force is small.

In addition, the capacitance of the element 2 is greatly changed as the distance between the first electrode 6 and the second electrode 8 is greatly changed, thus improving power generating performance.

A gradual deformation is caused over a wide range of the element 2 owing to the presence of the space 10 and a small curvature of the element 2, thus improving power generating performance.

A third embodiment of the present invention is described below with reference to FIG. 10.

In the third embodiment, two moving members 3 are disposed inside the element 2 of the power generating device 1. In a case in which multiple moving members 3 are disposed, the number of times when the moving members 3 contact the element 2 is increased compared to a case in which only one moving member 3 is disposed, thereby improving power generating performance. The number of moving members 3 may be 3 or more.

A fourth embodiment of the present invention is described below with reference to FIG. 11.

In the fourth embodiment, a moving member 11 that is different from the moving member 3 in material, shape, and/or size is disposed together with the moving member 3 inside the element 2 of the power generating device 1. The moving member 3 and the moving member 11 start moving at different vibration frequencies. Therefore, the element 2 is capable of generating power even when the vibration frequency distribution is wide or variable.

The number of the moving members 3 and that of the moving members 11 may be each two or more. Alternatively, three or more types of moving members which are different in material, shape, and/or size may be disposed inside the element 2.

EXAMPLES

Example 1

Preparation of Intermediate Layer

An intermediate layer was prepared in the following manner.

First, a silicone rubber (KE-1935 available from Shin-Etsu Chemical Co., Ltd.) was applied onto a polyethylene terephthalate film (S10 LUMIRROR #100 available from Toray Industries, Inc., having a thickness of 100 μm) and heated at 120° C. for 30 minutes to cure, thus forming a thin film having a thickness of 150 μm.

The thin film was then subjected to a corona discharge treatment while setting the applied voltage to 100 V and the accumulated energy to 60 J/cm$^2$, in the air as a reaction atmosphere.

The thin film of the silicone rubber was peeled off from the polyethylene terephthalate film. Thus, an intermediate layer of Example 1 was prepared.

Preparation of Element

An element having a cross section illustrated in FIG. 2A and an inner space shape illustrated in FIG. 1 was prepared in the following manner.

On the whole inner surfaces of a non-chargeable styrol case (C-39 available from AS ONE Corporation, having an outer dimension of 80 mm×80 mm×32 mm), serving as the frame 4, a nickel-plated non-woven fabric double-sided tape (CN4490 available from 3M, having a thickness of 50 µm), serving as the second electrode 8, was laminated. On the second electrode 8, the above-prepared thin film of the silicone rubber having a thickness of 150 µm, serving as the intermediate layer 7, was laminated. On the intermediate layer 7, a copper-nickel-plated conductive fabric (Sui-80-M30 available from Seiren Co., Ltd., having a thickness of 35 µm), serving as the first electrode 6, was laminated. On the first electrode 6, a polyvinyl chloride film (SLF-C02 available from EUROPORT Co., Ltd., having a thickness of 30 µm), serving as the cover member 5, was laminated. Thus, an element of Example 1 was prepared.

Preparation of Power Generating Device

A power generating device having the configuration illustrated in FIG. 1A was prepared in the following manner.

One stainless-steel sphere (SUS-5/8 available from AS ONE Corporation, having a diameter of 15.9 mm), serving as the moving member 3, was put in the inner space of the above-prepared element. Thus, a power generating device of Example 1 was prepared.

Evaluation of Power Generation Performance of the Power Generating Device

Power generation performance was evaluated in the following manner.

Figure 12:
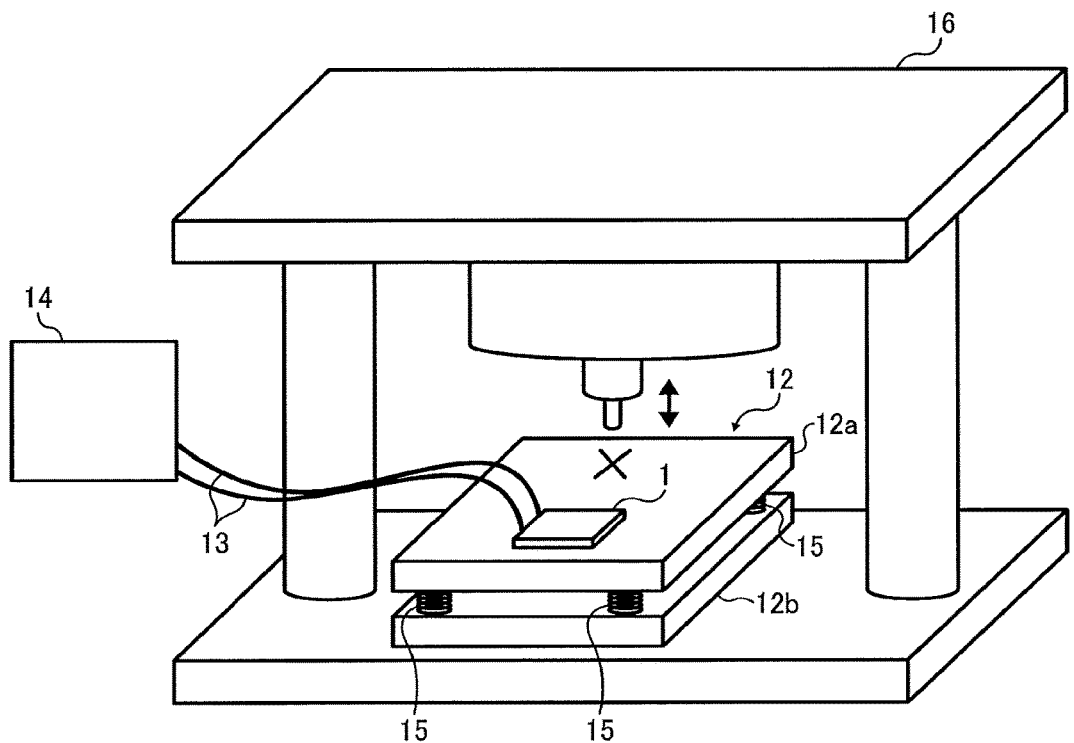
FIG. 12 is a perspective view of a vibration tester used in a vibration test.

The above-prepared power generating device of Example 1 was secured to a sample stage 12 illustrated in FIG. 12 with a screw, and connected to an oscilloscope 14 (Wave Ace 1001 available from Teledyne LeCroy, having a resistance of 1 MΩ) via lead wires 13 (C3/RV-90 0.75SQ available from Taiyo Cabletec Corporation).

The sample stage 12 includes two acrylic plates 12a and 12b (COMOGLAS having a thickness of 3 mm and an area of 250 mm×250 mm, available from Kuraray Co., Ltd.) and four coil springs 15 (AS050-010-0.4 available from Showa Spring Co., Ltd.) disposed between the acrylic plates 12a and 12b at the four corners.

The sample stage 12 was vibrated by a vibration tester 16 (Fatigue Durability Tester FRDS20-RC available from Asahi Seisakusyo). Peak voltages generated under the following vibration conditions 1 to 4 were measured by the oscilloscope 14.

TABLE 1

| | Displacement | Frequency | Time |
|---|---|---|---|
| Vibration Condition 1 | 4 mm | 10 Hz | 5 minutes |
| Vibration Condition 2 | 4 mm | 20 Hz | 5 minutes |
| Vibration Condition 3 | 4 mm | 30 Hz | 5 minutes |
| Vibration Condition 4 | 4 mm | 20 Hz | 3 hours |

Each measured peak voltage was normalized based on that measured in Comparative Example 1 (to be described later) under the vibration condition 2. Power generation performance of each power generating device was evaluated based on the criteria described in Table 2. The evaluation results are presented in Table 3.

TABLE 2

| | |
|---|---|
| Rank A | Normalized voltages under vibration conditions 1-4 are all 15 or more. |
| Rank B | Normalized voltages under vibration conditions 1-4 are all 10 or more. |
| Rank C | Normalized voltages under vibration conditions 1-4 are all 5 or more. |
| Rank D | Normalized voltages under vibration conditions 1-4 are all 3 or more. |
| Rank E | Normalized voltages under vibration conditions 1-4 are all 1 or more. |
| Rank F | Other than those above. |

Example 2

Preparation of Element

An element of Example 2 was prepared in the same manner as in Example 1.

Preparation of Power Generating Device

A power generating device having a configuration illustrated in FIG. 10 was prepared in the following manner.

Two stainless-steel spheres (SUS-5/8 available from AS ONE Corporation, having a diameter of 15.9 mm), each serving as the moving member 3, were put in the inner space of the above-prepared element. Thus, a power generating device of Example 2 was prepared.

Evaluation of Power Generation Performance of the Power Generating Device

The power generating device of Example 2 was subjected to the evaluation of power generation performance in the same manner as in Example 1. The evaluation results are presented in Table 3.

Example 3

Preparation of Element

An element of Example 3 was prepared in the same manner as in Example 1.

Preparation of Power Generating Device

A power generating device having a configuration illustrated in FIG. 10 was prepared in the following manner.

Twenty zirconia balls (YTZ-10 available from AS ONE Corporation, having a diameter of 10 mm), each serving as the moving member 3, were put in the inner space of the above-prepared element. Thus, a power generating device of Example 3 was prepared.

Evaluation of Power Generation Performance of the Power Generating Device

The power generating device of Example 3 was subjected to the evaluation of power generation performance in the same manner as in Example 1. The evaluation results are presented in Table 3.

Example 4

Preparation of Intermediate Layer

An intermediate layer of Example 4 was prepared in the same manner as in Example 1.

Preparation of Element

An element having a cross section illustrated in FIG. 9A and an inner space shape illustrated in FIG. 1 was prepared in the following manner.

On the whole inner surfaces of a non-chargeable styrol case (C-39 available from AS ONE Corporation, having an outer dimension of 80 mm×80 mm×32 mm), serving as the frame 4, a nickel-plated non-woven fabric double-sided tape (CN4490 available from 3M, having a thickness of 50 µm), serving as the second electrode 8, was laminated. On the second electrode 8, the above-prepared thin film of the silicone rubber having a thickness of 150 µm, serving as the intermediate layer 7, was laminated. On the intermediate layer 7, a KAPTON tape P-222 (available from Nitto Denko Corporation, having a thickness of 100 μm and a width of 3 mm, in a grid pattern with a pitch of 40 mm), serving as the spacer 9, was laminated. On the spacer 9, a copper-nickel-plated conductive fabric (Sui-80-M30 available from Seiren Co., Ltd., having a thickness of 35 μm), serving as the first electrode 6, was laminated. On the first electrode 6, a polyvinyl chloride film (SLF-C02 available from EURO-PORT Co., Ltd., having a thickness of 30 μm), serving as the cover member 5, was laminated. Thus, an element of Example 4 was prepared.

Preparation of Power Generating Device

A power generating device having a configuration illustrated in FIG. 10 was prepared in the following manner.

Twenty zirconia balls (YTZ-10 available from AS ONE Corporation, having a diameter of 10 mm), each serving as the moving member 3, were put in the inner space of the above-prepared element. Thus, a power generating device of Example 4 was prepared.

Evaluation of Power Generation Performance of the Power Generating Device

The power generating device of Example 4 was subjected to the evaluation of power generation performance in the same manner as in Example 1. The evaluation results are presented in Table 3.

Example 5

Preparation of Intermediate Layer

An intermediate layer was prepared in the following manner.

First, 100 parts by mass of a silicone rubber (IVS4312 available from Momentive Performance Materials Inc.) and 50 parts by mass of barium titanate (208108 available from Sigma-Aldrich) were mixed to prepare a silicone rubber composition.

Next, the silicone rubber composition was applied onto a polyethylene terephthalate film (S10 LUMIRROR #100 available from Toray Industries, Inc., having a thickness of 100 μm) and heated at 120° C. for 30 minutes to cure, thus forming a thin film having a thickness of 100 μm.

The thin film was then subjected to a plasma treatment using an instrument PR-500 (available from Yamato Scientific Co., Ltd.) while setting the output to 100 V, the treatment time to 4 minutes, and the reaction pressure to 10 Pa, in an reaction atmosphere containing 99.999% of argon.

The thin film of the barium-titanate-blended silicone rubber was peeled off from the polyethylene terephthalate film. Thus, an intermediate layer of Example 5 was prepared.

Preparation of Element

An element having a cross section illustrated in FIG. 9A and an inner space shape illustrated in FIG. 1 was prepared in the following manner.

On the whole inner surfaces of a non-chargeable styrol case (C-39 available from AS ONE Corporation, having an outer dimension of 80 mm×80 mm×32 mm), serving as the frame 4, a nickel-plated non-woven fabric double-sided tape (CN4490 available from 3M, having a thickness of 50 μm), serving as the second electrode 8, was laminated. On the second electrode 8, the above-prepared thin film of the barium-titanate-blended silicone rubber having a thickness of 100 μm, serving as the intermediate layer 7, was laminated. On the intermediate layer 7, a KAPTON tape P-222 (available from Nitto Denko Corporation, having a thickness of 100 μm and a width of 3 mm, in a grid pattern with a pitch of 40 mm), serving as the spacer 9, was laminated. On the spacer 9, a copper-nickel-plated conductive fabric (Sui-80-M30 available from Seiren Co., Ltd., having a thickness of 35 μm), serving as the first electrode 6, was laminated. On the first electrode 6, a polyvinyl chloride film (SLF-C01 available from EUROPORT Co., Ltd., having a thickness of 50 μm), serving as the cover member 5, was laminated. Thus, an element of Example 5 was prepared.

Preparation of Power Generating Device

A power generating device having a configuration illustrated in FIG. 10 was prepared in the following manner.

Five nylon spheres (ND-10 available from AS ONE Corporation, having a diameter of 19.1 mm), each serving as the moving member 3, were put in the inner space of the above-prepared element. Thus, a power generating device of Example 5 was prepared.

Evaluation of Power Generation Performance of the Power Generating Device

The power generating device of Example 5 was subjected to the evaluation of power generation performance in the same manner as in Example 1. The evaluation results are presented in Table 3.

Example 6

Preparation of Element

An element of Example 6 was prepared in the same manner as in Example 5.

Preparation of Power Generating Device

A power generating device having a configuration illustrated in FIG. 11 was prepared in the following manner.

Three nylon spheres (ND-10 available from AS ONE Corporation, having a diameter of 19.1 mm), each serving as the moving member 3, and fifteen zirconia balls (YTZ-10 available from AS ONE Corporation, having a diameter of 10 mm), each serving as the moving member 11, were put in the inner space of the above-prepared element. Thus, a power generating device of Example 6 was prepared.

Evaluation of Power Generation Performance of the Power Generating Device

The power generating device of Example 6 was subjected to the evaluation of power generation performance in the same manner as in Example 1. The evaluation results are presented in Table 3.

Example 7

Preparation of Element

An element of Example 7 was prepared in the same manner as in Example 5.

Preparation of Power Generating Device

A power generating device having a configuration illustrated in FIG. 11 was prepared in the following manner.

Three nylon spheres (ND-10 available from AS ONE Corporation, having a diameter of 19.1 mm), each serving as the moving member 3; ten zirconia balls (YTZ-10 available from AS ONE Corporation, having a diameter of 10 mm), each serving as a moving member 11a; and two stainless-steel spheres (SUS-5/8 available from AS ONE Corporation, having a diameter of 15.9 mm), each serving as a moving member 11b, were put in the inner space of the above-prepared element. Thus, a power generating device of Example 7 was prepared.

Evaluation of Power Generation Performance of the Power Generating Device

The power generating device of Example 7 was subjected to the evaluation of power generation performance in the same manner as in Example 1. The evaluation results are presented in Table 3.

Example 8

Preparation of Intermediate Layer

An intermediate layer of Example 8 was prepared in the same manner as in Example 5.

Preparation of Element

An element having a cross section illustrated in FIG. 9A and an inner space shape illustrated in FIG. 3B was prepared in the following manner.

On the whole inner surfaces of a cylindrical case (Unix Tight Lock TLR-20Ag available from AS ONE Corporation, having a diameter of 107 mm and a height of 59 mm), serving as the frame 4, a nickel-plated non-woven fabric double-sided tape (CN4490 available from 3M, having a thickness of 50 μm), serving as the second electrode 8, was laminated. On the second electrode 8, the above-prepared thin film of the barium-titanate-blended silicone rubber having a thickness of 100 μm, serving as the intermediate layer 7, was laminated. On the intermediate layer 7, a KAPTON tape P-222 (available from Nitto Denko Corporation, having a thickness of 100 μm and a width of 3 mm, in a grid pattern with a pitch of 40 mm), serving as the spacer 9, was laminated. On the spacer 9, a copper-nickel-plated conductive fabric (Sui-80-M30 available from Seiren Co., Ltd., having a thickness of 35 μm), serving as the first electrode 6, was laminated. On the first electrode 6, a polyvinyl chloride film (SLF-C02 available from EUROPORT Co., Ltd., having a thickness of 30 μm), serving as the cover member 5, was laminated. Thus, an element of Example 8 was prepared.

Preparation of Power Generating Device

A power generating device having a configuration illustrated in FIG. 11 was prepared in the following manner.

One nylon sphere (ND-12 available from AS ONE Corporation, having a diameter of 25.4 mm), serving as the moving member 3; three nylon spheres (ND-10 available from AS ONE Corporation, having a diameter of 19.1 mm), each serving as a moving member 11a; and fifteen nylon spheres (ND-8 available from AS ONE Corporation, having a diameter of 12.7 mm), each serving as a moving member 11b, were put in the inner space of the above-prepared element. Thus, a power generating device of Example 8 was prepared.

Evaluation of Power Generation Performance of the Power Generating Device

The power generating device of Example 8 was subjected to the evaluation of power generation performance in the same manner as in Example 1. The evaluation results are presented in Table 3.

Example 9

Preparation of Element

An element having a cross section illustrated in FIG. 2A and an inner space shape illustrated in FIG. 1A was prepared in the following manner.

On the whole inner surfaces of a non-chargeable styrol case (C-39 available from AS ONE Corporation, having an outer dimension of 80 mm×80 mm×32 mm), serving as the frame 4, a polyvinylidene fluoride (PVDF) piezo film (including a PVDF layer having a thickness of 110 μm and a silver electrode having a thickness of 6 μm, available from Tokyo Sensor Co., Ltd.) was laminated. On the PVDF piezo film, a polyvinyl chloride film (SLF-C02 available from EUROPORT Co., Ltd., having a thickness of 30 μm), serving as the cover member 5, was laminated. Thus, an element of Example 9 was prepared.

Preparation of Power Generating Device

A power generating device having a configuration illustrated in FIG. 10 was prepared in the following manner.

Two stainless-steel spheres (SUS-5/8 available from AS ONE Corporation, having a diameter of 15.9 mm), each serving as the moving member 3, were put in the inner space of the above-prepared element. Thus, a power generating device of Example 9 was prepared.

Evaluation of Power Generation Performance of the Power Generating Device

The power generating device of Example 9 was subjected to the evaluation of power generation performance in the same manner as in Example 1. The evaluation results are presented in Table 3.

Comparative Example 1

Preparation of Element

An element having a cross section illustrated in FIG. 2A and an inner space shape illustrated in FIG. 1A was prepared in the following manner.

On the whole inner surfaces of a non-chargeable styrol case (C-39 available from AS ONE Corporation, having an outer dimension of 80 mm×80 mm×32 mm), serving as the frame 4, a piezoelectric ceramics (L-2H available from Lead Techno K.K., including a PZT layer and a gold electrode, having a total thickness of 500 μm) was laminated. On the piezoelectric ceramics, a polyvinyl chloride film (SLF-C02 available from EUROPORT Co., Ltd., having a thickness of 30 μm), serving as the cover member 5, was laminated. Thus, an element of Comparative Example 1 was prepared.

Preparation of Power Generating Device

A power generating device having a configuration illustrated in FIG. 10 was prepared in the following manner.

Two stainless-steel spheres (SUS-5/8 available from AS ONE Corporation, having a diameter of 15.9 mm), each serving as the moving member 3, were put in the inner space of the above-prepared element. Thus, a power generating device of Comparative Example 1 was prepared.

Evaluation of Power Generation Performance of the Power Generating Device

The power generating device of Comparative Example 1 was subjected to the evaluation of power generation performance in the same manner as in Example 1. The evaluation results are presented in Table 3.

Comparative Example 2

Preparation of Element

An element of Comparative Example 2 was prepared in the same manner as in Example 1.

Preparation of Power Generating Device

Nothing was put in the inner space of the above-prepared element. Thus, a power generating device of Comparative Example 2 was prepared.

Evaluation of Power Generation Performance of the Power Generating Device

The power generating device of Comparative Example 2 was subjected to the evaluation of power generation performance in the same manner as in Example 1. The evaluation results are presented in Table 3.

TABLE 3

Figure 10:
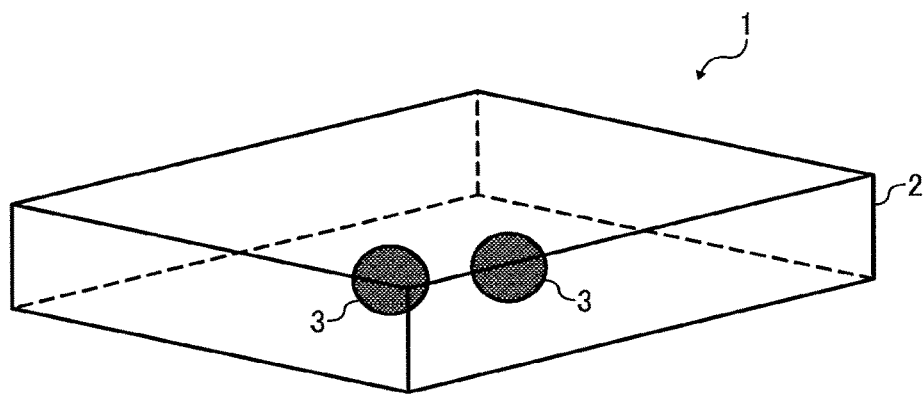
FIG. 10 is a perspective view of a power generating device according to an embodiment of the present invention.
Figure 11:
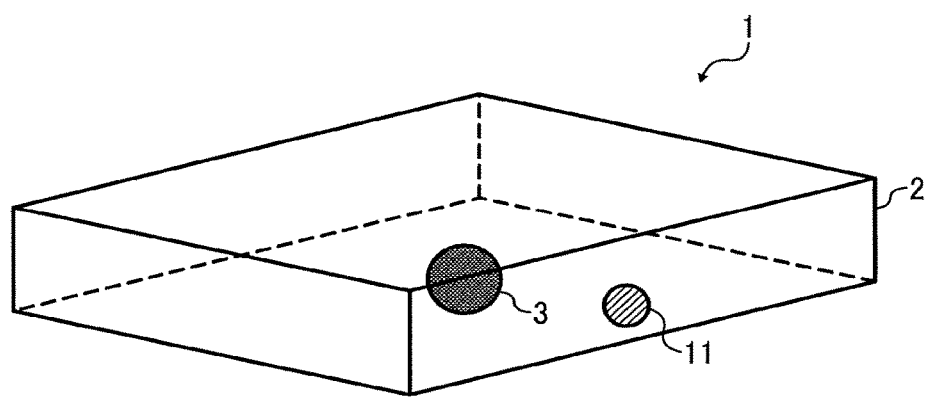
FIG. 11 is a perspective view of a power generating device according to an embodiment of the present invention.

| | Configurations | | | | Moving Member | | | |
|---|---|---|---|---|---|---|---|---|
| | Power Generating Device | Element | Inner Space of Element | Intermediate Layer Material | Material | Shape | Size (Diameter) | Number |
| Example 1 | FIG. 1A | FIG. 2A | FIG. 1A | Silicone Rubber | Stainless Steel | Sphere | 15.9 mm | 1 |
| Example 2 | FIG. 10 | FIG. 2A | FIG. 1A | Silicone Rubber | Stainless Steel | Sphere | 15.9 mm | 2 |
| Example 3 | FIG. 10 | FIG. 2A | FIG. 1A | Silicone Rubber | Zirconia | Sphere | 10 mm | 20 |
| Example 4 | FIG. 10 | FIG. 9A | FIG. 1A | Silicone Rubber | Zirconia | Sphere | 10 mm | 20 |
| Example 5 | FIG. 10 | FIG. 9A | FIG. 1A | Barium-titanate-blended Silicone Rubber | Nylon | Sphere | 19.1 mm | 5 |
| Example 6 | FIG. 11 | FIG. 9A | FIG. 1A | Barium-titanate-blended Silicone Rubber | Nylon / Zirconia | Sphere / Sphere | 19.1 mm / 10 mm | 3 / 15 |
| Example 7 | FIG. 11 | FIG. 9A | FIG. 1A | Barium-titanate-blended Silicone Rubber | Nylon / Zirconia / Stainless Steel | Sphere / Sphere / Sphere | 19.1 mm / 10 mm / 15.9 mm | 3 / 10 / 2 |
| Example 8 | FIG. 11 | FIG. 9A | FIG. 3B | Barium-titanate-blended Silicone Rubber | Nylom / Nylon / Nylon | Sphere / Sphere / Sphere | 25.4 mm / 19.1 mm / 12.7 mm | 1 / 3 / 15 |
| Example 9 | FIG. 10 | FIG. 2A | FIG. 1A | Polyvinylidene Fluoride | Stainless Steel | Sphere | 15.9 mm | 2 |
| Comparative Example 1 | FIG. 10 | FIG. 2A | FIG. 1A | Piezoelectric Ceramics | Stainless Steel | Sphere | 15.9 mm | 2 |
| Comparative Example 2 | N/A | FIG. 2A | FIG. 1A | Silicone Rubber | N/A | | | |

| | Power Generation Performance | | | | |
|---|---|---|---|---|---|
| | Normalized Voltage | | | | |
| | Vibration Condition 1 | Vibration Condition 2 | Vibration Condition 3 | Vibration Condition 4 | Rank |
| Example 1 | 4 | 5 | 13 | 5 | D |
| Example 2 | 9 | 14 | 10 | 13 | C |
| Example 3 | 12 | 20 | 15 | 20 | B |
| Example 4 | 18 | 35 | 26 | 34 | A |
| Example 5 | 12 | 24 | 22 | 24 | B |
| Example 6 | 30 | 44 | 20 | 44 | A |
| Example 7 | 27 | 34 | 21 | 32 | A |
| Example 8 | 21 | 30 | 25 | 30 | A |
| Example 9 | 1 | 2 | 3 | 1 | E |
| Comparative Example 1 | 0.6 | 1 (Standard) | 5 | 0.2 | F |
| Comparative Example 2 | 0.4 | 1 | 2 | 1 | F |

It is clear from comparison of the voltages measured under the vibration conditions 2 and 4, which are same in frequency but different in time, the voltage varies very little under continuous vibration, in each of the power generating devices of Examples 1 to 8.

By contrast, the voltage drastically decreases under continuous vibration in the power generating device of Comparative Example 1.

Table 4 lists the rate of decrease in normalized voltage when the vibration condition is changed from the vibration condition 2 to the vibration condition 4.

TABLE 4

| | Surface Modification Treatment | Rate of Decrease in Normalized Voltage (Vibration Condition 2 to 4) |
|---|---|---|
| Example 1 | Yes (Silicone Rubber) | Not changed |
| Example 2 | Yes (Silicone Rubber) | 7% |
| Example 3 | Yes (Silicone Rubber) | Not changed |
| Example 4 | Yes (Silicone Rubber) | 3% |
| Example 5 | Yes (Silicone-based Rubber) | Not changed |
| Example 6 | Yes (Silicone-based Rubber) | Not changed |
| Example 7 | Yes (Silicone-based Rubber) | 6% |
| Example 8 | Yes (Silicone-based Rubber) | Not changed |
| Example 9 | No (PVDF) | 50% |

TABLE 4-continued

| | Surface Modification Treatment | Rate of Decrease in Normalized Voltage (Vibration Condition 2 to 4) |
|---|---|---|
| Comparative Example 1 | No (Piezoelectric Ceramics) | 80% |

The above results indicate that, in the power generating devices according to some embodiments of the present invention, deterioration of the element is suppressed even the element is repeatedly impacted by the moving member, and thus such power generating devices can provide superior power generation performance for an extended period of time. In other words, the power generating devices according to some embodiments of the present invention are capable of stably and reliably generating power in repeated use.

In Examples 1 to 8, the intermediate layer includes a silicone or silicone-based rubber which has been subjected to a surface modification treatment. It is clear from comparison between Examples 1-8 and Examples 9 that when the intermediate layer includes such a surface-modified silicone or silicone-based rubber, the voltage varies very little with time.

With respect to Example 9, the rate of decrease in normalized voltage is larger than those of Examples 1 to 8. However, early deterioration of the element, which may be caused by repeated impact from the moving member, is more suppressed in Example 9 compared to Comparative Example 1.

It is clear from comparison of the voltages measured under the vibration conditions 1 to 3, each of the power generating devices of Examples 1 to 9 generates a greater voltage than that of Comparative Example 1.

Thus, the power generating devices according to some embodiments of the present invention can suppress early deterioration of the element which may be caused by repeated impact from the moving member, thus providing excellent power generating performance.

With respect to the power generating devices of Examples 6 to 8 including multiple moving members, it is clear from comparison of the voltages measured under the vibration condition 1 that they generate a high voltage even when the vibration frequency is the lowest (10 Hz).

Therefore, these power generating devices are capable of generating power even when the vibration frequency distribution is wide or variable.

The power generating devices according to some embodiments of the present invention can be used in various situations where environmental energy is usable. For example, the power generating device may be installed on a pallet to be loaded on a truck deck to be used as a power source for managing position information of physical distribution materials.

Electric power obtained from vibration may be accumulated in a power storage.

Application Example of Power Generating Device

As an application example, the power generating device according to an embodiment of the present invention may be applied for power generation using vibration caused by truck transportation.

Figure 13:
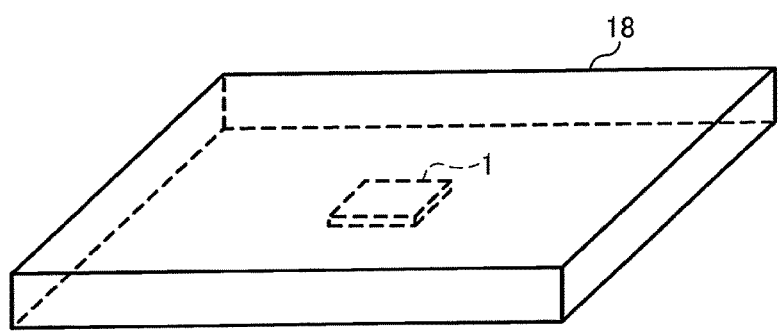
FIG. 13 is a perspective view illustrating an application example a power generating device according to an embodiment of the present invention.

As illustrated in FIG. 13, the power generating device 1 may be installed inside a pallet 18 used for physical distribution. As the pallet 18 is transported by truck, power is generated. In a case in which the pallet 18 has a slot into which a forklift is inserted, the power generating device 1 is preferably installed away from the slot. The number of the power generating devices 1 to be installed may be two or more.

In the above-described embodiments, the cover member 5 is disposed on the surface of the first electrode 6 to prevent the moving member 3 from directly contacting the first electrode 6, thus preventing the first electrode 6 from deteriorating. In a case in which the first electrode 6 itself is formed of a material that adsorbs impact from the moving member 3, the cover member 5 is unnecessary.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A power generating device comprising:
an element being deformable, that generates power when deforming, and comprises a pair of electrodes, and
an intermediate layer having elasticity, disposed between the electrodes in a thickness direction of the element; and
a moving member that moves when receiving a vibration, configured to contact the element when moving,
wherein, when the moving member contacts the element, the element deforms into another state or returns to a previous state,
wherein the intermediate layer comprises at least one of a rubber and a rubber composition, and
wherein the intermediate layer has a first side and a second side opposite the first side in the thickness direction of the element, and the first side has been subjected to a surface modification treatment and an inactivation treatment, which causes the first side and the second side to deform to different degrees of deformation when the same deformation imparting force is applied thereto and causes the first side to store charge.

2. The power generating device of claim 1, wherein, when the element deforms, triboelectric charge or peeling charge is caused between the first side of the intermediate layer and one of the pair of electrodes facing the first side.

3. The power generating device of claim 2, further comprising a spacer disposed between the first side of the intermediate layer and one of the pair of electrodes facing the first side.

4. The power generating device of claim 1, wherein the intermediate layer includes a silicone rubber.

5. The power generating device of claim 4,
wherein the intermediate layer includes an organosiloxane bond, and
wherein the intermediate layer has an oxygen concentration profile that increases from the first side toward inward while exhibiting a local maximum value, and a carbon concentration profile that decreases from the first side toward inward while exhibiting a local minimum value.

6. The power generating device of claim 1, further comprising a cover member having flexibility.

7. The power generating device of claim 6, wherein the cover member covers one of the electrodes contactable with the moving member.

8. The power generating device of claim 1, wherein the moving member includes a plurality of moving members.

9. The power generating device of claim 8, wherein the moving members are made of different materials.

10. The power generating device of claim 8, wherein the moving members have different shapes.

11. The power generating device of claim 8, wherein the moving members have different sizes.

12. A power generating device comprising:
an element being deformable, that generates power when deforming, and comprises a pair of electrodes, and
an intermediate layer having elasticity, disposed between the electrodes in a thickness direction of the element; and
a moving member that moves when receiving a vibration, configured to contact the element when moving,
wherein, when the moving member contacts the element, the element deforms into another state or returns to a previous state,
wherein the intermediate layer comprises at least one of a rubber and a rubber composition, and
wherein the intermediate layer has a first side and a second side opposite the first side in the thickness direction of the element, and the first side has been subjected to at least one of a surface modification treatment and an inactivation treatment, which causes the first side and the second side to deform to different degrees of deformation when the same deformation imparting force is applied thereto and causes the first side to store charge wherein the intermediate layer includes a silicone rubber, wherein the intermediate layer includes an organosiloxane bond, and wherein the intermediate layer has an oxygen concentration profile that increases from the first side toward inward while exhibiting a local maximum value, and a carbon concentration profile that decreases from the first side toward inward while exhibiting a local minimum value.

* * * * *